(12) United States Patent
Anderson et al.

(10) Patent No.: US 7,425,795 B2
(45) Date of Patent: Sep. 16, 2008

(54) CUSTOMIZABLE ELECTROLUMINESCENT DISPLAYS

(75) Inventors: Frank Edward Anderson, Sadieville, KY (US); Michael John Dixon, Richmond, KY (US); James Paul Drummond, Georgetown, KY (US); Bryan Dale McKinley, Lexington, KY (US); Amanda Kay Plakosh-Angeles, Lexington, KY (US); Jerry Randall Reed, Mt. Vernon, KY (US); Jeanne Marie Saldanha Singh, Lexington, KY (US); George Nelson Woolcott, Lancaster, KY (US)

(73) Assignee: Lexmark International, Inc., Lexington, KY (US)

( * ) Notice: Subject to any disclaimer, the term of this patent is extended or adjusted under 35 U.S.C. 154(b) by 302 days.

(21) Appl. No.: 11/209,468

(22) Filed: Aug. 23, 2005

(65) Prior Publication Data

US 2007/0046197 A1    Mar. 1, 2007

(51) Int. Cl.
*H01J 1/62* (2006.01)
*H01J 63/04* (2006.01)

(52) U.S. Cl. ...................... 313/509; 313/506
(58) Field of Classification Search .......... 313/498–512
See application file for complete search history.

(56) References Cited

U.S. PATENT DOCUMENTS

| | | | |
|---|---|---|---|
| 3,173,050 A * | 3/1965 | Gurnee | 313/504 |
| 4,560,902 A | 12/1985 | Kardon | |
| 5,469,019 A | 11/1995 | Mori | |
| 5,488,266 A * | 1/1996 | Aoki et al. | 313/509 |
| 5,808,412 A | 9/1998 | Zovko et al. | |
| 6,054,809 A * | 4/2000 | Haynes et al. | 313/505 |
| 6,274,985 B1 | 8/2001 | Haynes | |
| 6,727,647 B2 * | 4/2004 | Fukuda et al. | 313/506 |
| 6,749,773 B2 | 6/2004 | Emanuel | |
| 7,067,972 B2 * | 6/2006 | Watanabe et al. | 313/500 |
| 2001/0035716 A1 | 11/2001 | Murasko | |
| 2002/0090495 A1 | 7/2002 | Bezenek et al. | |
| 2002/0142188 A1 | 10/2002 | Andriash | |
| 2004/0217703 A1 * | 11/2004 | Wittmann et al. | 313/512 |

OTHER PUBLICATIONS

U.S. Appl. No. 11/092,090, Commonly owned.
Professor Jack Silver, Phosphor Materials for Printing Inorganic Displays, The University of Greenwich, from Internet, known approximate date Aug. 2004, 35 pages (unnumbered).

* cited by examiner

*Primary Examiner*—Nimeshkumar D. Patel
*Assistant Examiner*—Thomas A Hollweg
(74) *Attorney, Agent, or Firm*—Dinsmore & Shohl, LLP

(57) ABSTRACT

This invention addresses how an end user can create an electroluminescent device (1, 31) using basic components obtained by the end user as retail items. The layers or subassemblies (15, 17) are created first. Then the layers are assembled to form a completed device customized as selected by the end user. The subassemblies may be created layer-by-layer by thermal inkjet. Elements used typically will be made by manufacturers and sold commercially separately. This encompasses the printing of conductive patterns for electroluminescence on paper. In one aspect a display has a main body that may be permanent and useful indefinitely, while a part carrying the conductive pattern defining the display is readily removed and is replaced by another such part on which a new conductive pattern is printed. For tight contact with the main body, the display provides releasable pressure. Air pockets are minimized with a thin layer of highly viscous dielectric liquid.

11 Claims, 4 Drawing Sheets

CUSTOMIZABLE ELECTROLUMINESCENT DISPLAYS

TECHNICAL FIELD

This invention relates to luminous displays, specifically electroluminescent displays, that may be readily varied in the patterns or text displayed.

BACKGROUND OF THE INVENTION

In electroluminscence (EL), light is produced by applying an electric field upon an emitter material. Applying this field upon the emitter supplies the material with energized electrons that can then decay to produce photons. This results in devices that can be used for illumination. The structure of these devices can be relatively simple containing two electrodes, an emitter layer and some passivation layers. There may also be other dielectric or transport layers as deemed necessary in particular applications. Currently, these layers are assembled by a manufacturer and the completed EL device is purchased by an end user.

Electroluminescent displays are known which produce bright, attractive light pictures and messages at low cost in power. Since such devices are currently completed by a manufacturer, the end user necessarily has a limited selection. A need exists for such displays that can be customized or modified readily by the user at low cost.

U.S. Patent Publication No. 2002/0090495 A1 describes multilayer sheet forming a complete electroluminescent device that is to receive inkjet printing on an outer surface. The inkjet printing forms a mask and the electrolumination serves a back lighting for the mask printer. This requires an inkjet printer that can print on such a multilayer device and requires the multilayer device to be resistant to damage by the printing operation.

Accordingly, a need exists for customization of electroluminescent devices by printing on easily manipulated and sturdy substrates, including inexpensive substrates such as paper.

DISCLOSURE OF THE INVENTION

This invention addresses how an end user can create an EL device structure using basic components obtained by the end user as retail items. The layers or subassemblies are created first. Then the layers are matched, mated and assembled to form a completed EL device customized as selected by the end user. The subassemblies may be created in a layer-by-layer procedure using application by thermal inkjet. The subassemblies typically will be made by manufacturers and sold commercially as subassemblies. Layers may be added to either one or possibly two original substrates. They can be formed into a functional EL device using joining techniques.

This invention encompasses the printing of conductive patterns for electroluminescence on substrates, which may be paper. The optical display is formed at least in part by the pattern of conductor printed. This paper or other substrate with a printed, conductive pattern is then combined in a laminate including other layers of elements of an electroluminescent display.

In one aspect, this invention provides an electroluminescent display in which the main body of the display may be permanent and useful indefinitely, while a part carrying the conductive pattern defining the display is readily removed and is replaced by another such part on which a new conductive pattern is printed. The printing is by conductive ink, preferably by inkjet printing. The removable part is in sheet form suitable to receive printing. The conductive pattern printed may be composed by standard techniques on a computer and delivered from the computer to the printer for printing by standard techniques. To have the conductive pattern on the sheet tightly contact the main body, the display provides releasable pressure.

In forming the final display, it is important to minimize air pockets. This invention provides for an inert, highly viscous liquid applied at the boundary between a removable conductive substrate and the dielectric layer of the electroluminescent device. The liquid may be a high dielectric. This liquid also facilitates separation of the conductive layer or sheet for substitution with a different conductive layer. Where the EL device is permanent and formed under substantial pressure using adhesive, the dielectric liquid is not necessary.

BRIEF DESCRIPTION OF THE DRAWINGS

The details of this invention will be described in connection with the accompanying drawings in which.

DESCRIPTION OF THE PREFERRED EMBODIMENTS

Electroluminescent devices produce light by applying an electric field upon an emitter material. Applying this field upon the emitter supplies the material with energized electrons that decay to produce photons. This results in devices that can be used for illumination or for display of pictures or text. The structure of these devices can be relatively simple, containing two electrodes, an emitter layer and a dielectric layer or layers to provide internal barriers.

Figure 1:
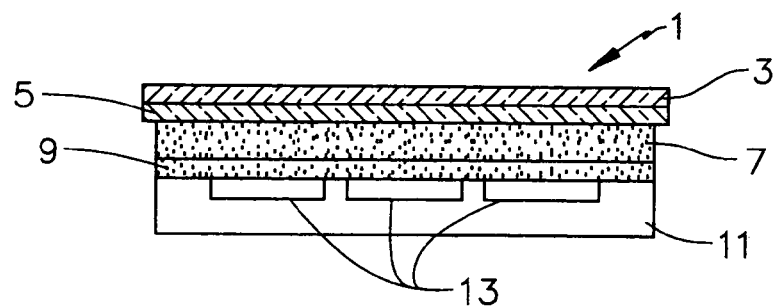
FIG. 1 illustrates a basic electroluminescent device consistent with this invention.

An electroluminescent device 1 of this invention is represented illustratively in FIG. 1. The front, light emitting side of device 1 is top layer 3, which also may be a support layer, such as glass.

The next layer from the top is layer 5, which is typically a continuous, transparent conductive layer. Various very thin metal and alloys are transparent conductors suitable for this purpose, specifically indium tin oxide.

The next layer from the top is layer 7, the emitter layer, which is phosphorescent material suspended in a resin matrix. Representative phosphorescent materials are AnS:Cu,Al (zinc sulfide doped with copper and aluminum) and AnS:Cu, Mn (zinc sulfide doped with copper and manganese).

The next layer from the top is layer 9, a dielectric layer that serves to physically protect emitter layer 7 while passing electrical drive signals through its dielectric characteristics. The dielectric layer 9 may comprise ceramic particles such as barium titanate suspended in a binder matrix.

The next element from the top is an insulating layer 11 having supporting electrically conductive elements 13 as an electrode in a pattern next to dielectric layer 9.

The drawing shows conductive elements 13 in close contact with dielectric layer 9, as is best for good operation to produce illumination in a pattern as defined by conductive elements 13. The structure of insulating layer 11 with conductive elements 13 can be formed by printing conductive elements 13 on a substrate such as ordinary or porous paper or a synthetic polymer such as MYLAR polyester films or other polymeric films. The paper or film is applied as insulating layer 11 and elements 13 are the electrode of the completed EL device.

In the drawings, elements directly corresponding to elements as described for earlier figures are given the same reference numeral.

In one embodiment of the invention, a device structure such as in FIG. 1 is constructed using a basic stack comprising of a transparent substrate such as polyester having a transparent conductor and then depositing the subsequent layers by different methods including inkjet printing. These subsequent layers include but are not limited to EL emitter layers, dielectric layers, transport layers, conductive layers and passivation layers.

A second possible embodiment is the first embodiment altered to allow one or more of the stated inkjet printed layers to be formed in a separate coating process prior to inkjet printing. In this embodiment, a precoated sheet used in the printing process may already contain a substrate, transparent conductor and an emitter layer. Following this embodiment, only a dielectric and conductor layer would need to be inkjet printed to form a device.

By extrapolation of this second embodiment, the precoated sheet could also contain the dielectric layer and/or other layers upon the emitter layer. This would leave only the conductor to be printed by an inkjet process. The choice of which layers would be included in the original substrate (provided by a manufacturer) would be governed by materials cost, sourcing, as well as the desired functionality of the resulting device.

Another possible structure begins by using a foil-based film as a substrate. Foil based films are common in packaging, and inexpensive to purchase. The initiation of a structure using the foil film presents a back plane electrode for the building of an El device. This film would frequently be purchased with passivation and/or dielectric layers already intact. A device structure could then be built upon this film by inkjet printing techniques. Adding an emitter layer and a transparent electrode would produce a simple device structure from this foil based substrate.

Construction and Assembly of the Stack

In another embodiment of the invention, two different stacks are created or obtained separately and then joined by various methods. The two stacks are initiated through two separate substrates: a polyester and a paper substrate, or any other desired substrates and the appropriate layers deposited as mentioned in the previous embodiments. These two substrates with desired layer structure would then be joined by one of several joining techniques to form the functional device structure. Joining techniques could include pressure sensitive adhesives, curable adhesives, heat sealant, or other mechanical joining methods. Important to this process is the formation of an intimate contact between these joined layers. Presence of air gaps could lead to poor device performance.

Adhesive Interlayer

Figure 2:
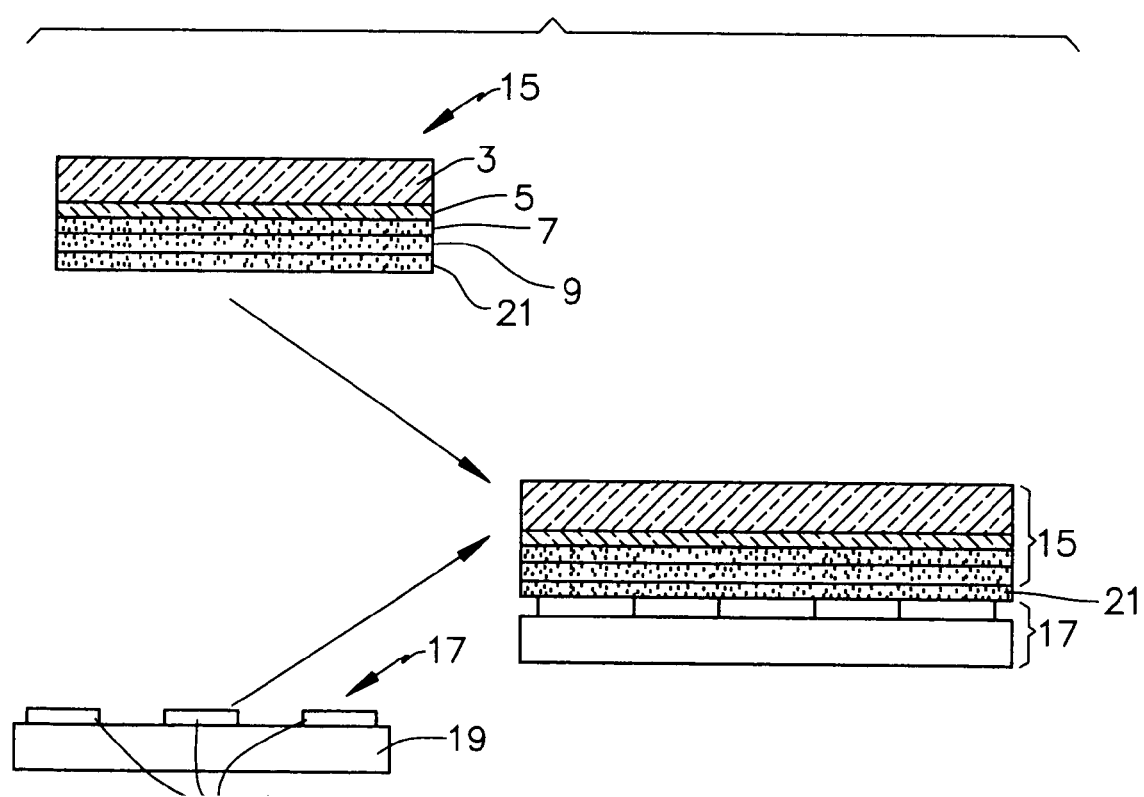
FIG. 2 illustrates two subassemblies of such a device and their combination.

In a preferred demonstration of this embodiment, as illustrated in FIG. 2, one subassembly 15 is built up having a transparent polyester substrate 3, a transparent indium tin oxide conductor 5, and a phosphor based emitter layer 7. A second subassembly 17 is built consisting of a paper substrate 19 having a patterned conductive electrode 13. An adhesive layer 21 is applied to one of the subassemblies, and the layers are then joined together using this adhesive joining technique. Careful attention is paid to removing all air pockets from the joint in order to achieve optimal performance. The structure of such a device is seen in FIG. 2 with the adhesive layer 21 on subassembly 15.

The adhesive layer used to join on subassembly 15 or, alternatively, on subassembly 17 can be either thermoplastic or thermosetting adhesives in the form of liquids, pastes or films. These can be dispensed using many different techniques including but not limited to screen printing, stenciling, spraying, laminating, wire rod or roll coating, spin coating, inkjet, etc. The adhesives can be dispensed or placed on the surfaces of either subassembly 15 or subassembly 17 or both and then mated together for joining. Then, depending on the adhesives selected, the mated structures could be exposed to various temperatures and/or pressure or other environments for intimate contact and setting or curing.

Some of the important characteristics of the adhesives for joining such structures while promoting the intensity of illumination of the EL display include but are not limited to adhesion to the different surfaces, no air entrapment in the critical areas, chemistry and structure of the adhesive, thickness, compliancy, rheology, mechanical, thermal, environmental and electrical properties.

Table I lists the different types of adhesives and processes used for joining subassembly 15 and subassembly 17 and the intensity of illumination achieved. The adhesives and laminating films mentioned in Table I are laminated onto either subassembly 15 or subassembly 17, the liner films (if present) are peeled away and then the two structures are mated together and laminated.

Lamination can be done using a hand roller, a cold or hot roll laminator (electric, oil or steam heated) or a variable temperature press. The temperature and speed of the lamination is varied to suit the adhesive being used. When using a roll laminator, nip clearance, stiffness/compliancy of the rolls, speed/residence time, temperature and pressure, are selected based on the characteristics of the adhesive and the components in the structure. Elimination of trapped air is critical.

For standardization, a roll laminator (Heat Seal H 300) or an electric iron was used for making the EL devices. After the adhesive was introduced and the two subassemblies 15 and 17 were mated, the composite stack was placed between polytetrafluoroethylene (PTFE) films and then laminated either with or without heat depending on the adhesives.

TABLE I

| Adhesives | Polymer | Thickness (inch) | Process | Dielectric constant @ 1 KHz | Intensity LUX (lumens/sq. meter) |
| --- | --- | --- | --- | --- | --- |
| 3M 9449S | acrylic - PSA | 0.0003 | cold roll lamination | — | 115 |

TABLE I-continued

| Adhesives | Polymer | Thickness (inch) | Process | Dielectric constant @ 1 KHz | Intensity LUX (lumens/sq. meter) |
|---|---|---|---|---|---|
| 3M 9461P | acrylic - PSA | 0.001 | cold roll lamination | — | 53 |
| 3M 845 | polyolefin bonding film | 0.0025 | hot roll | 2.3 | 1.2 |
| 3M 583 | phenolic based laminating film | 0.002 | hot roll | — | 144.7 |
| 3M 588 | phenolic based laminating film | 0.006 | hot roll | — | 3.4 |
| Rogers 1000B100 | phenolic based laminating film | 0.001 | hot roll | 4.0 | 226 |
| Allied Epoxyset #145-20005 | Two part epoxy liquid | | Mix 2 parts, coat and cure | — | 290 |
| Tesa 8410 tape | phenolic based laminating film | 0.0025 | hot roll | — | 68.9 |

The intensity of illumination reported in Table I was measured using an International Light meter Model IL 1400A against the transparent surface. The intensity is affected by the thickness of the adhesive and the dielectric properties of the layers involved, i.e., a higher dielectric constant of the adhesive and elimination of air gaps increases the intensity of illumination. A thin layer of a high dielectric polymeric adhesive, such as an epoxy or a phenolic layer provides higher intensity of illumination.

Printing the adhesive by different techniques as screen or inkjet can provide a thin layer and also enable selectivity such as printing directly onto the pattern or around the pattern.

Intensity of illumination can also be optimized by tuning the frequency for each type of polar adhesive Structure with External Sealant Layer (A Preferred Embodiment)

Whichever method of assembly is selected, customer appreciation is realized when the display provides a higher intensity of illumination. In order to have a higher intensity level, the capacitance contribution from the adhesive should be minimal. Thus, having no adhesive and elimination of air between subassembly 15 and subassembly 17 is often critical.

This is achieved through mating subassembly 15 and subassembly 17 with no adhesive in-between and then sealing the subassembly 17 on the back of subassembly 15 with an adhesive or sealant. The adhesives can be either in the form of liquids, pastes, solids, films, and the like. The adhesive/sealant can either be a thermoplastic or a thermoset—curable through radiation energy of various forms/wavelengths and or moisture.

Figure 3:
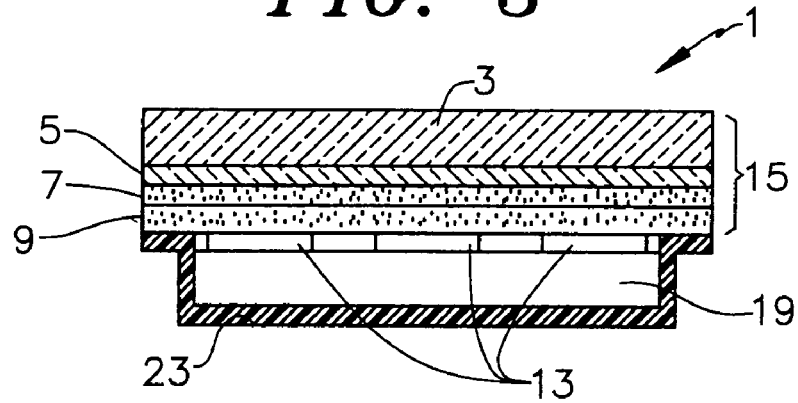
FIG. 3 illustrates a basic electroluminescent device having an outer sealing layer.

FIG. 3 represents an EL device in which subassembly 17 is sealed against subassembly 15. Some of the adhesives that work well for this concept include but are not limited to adhesive films such as 3M 845, 3M 560EG, 3M AHS148 and others mentioned in Table I. The most favorable adhesive was 3M 845 with a thickness of 0.002 to 0.004 inches. The liner/carrier layers of these adhesives were left intact through and after the lamination. Other bonding films/sealants with appropriate rheology, mechanical, chemical, thermal and adhesion properties in conjunction with process conditions could work well for this application.

In order to build an EL device with this method, the width of subassembly 17 needs to be smaller than the corresponding dimensions of subassembly 15 such that sufficient boundary area for adhesion is provided. The two structures are mated and then the adhesive/sealant film is placed on the outside of subassembly 17. This adhesive film extends over and beyond the dimensions of subassembly 17 but not beyond subassembly 15. The stack is then placed in between the PTFE sheets and laminated in a roll laminator (Heat Seal Model H300) under heat. The thermoplastic sealant layer 23 conforms around subassembly 17 and adheres directly to subassembly 15. In this method, the conductor pattern intimately adheres to the dielectric layer on subassembly 15.

Using an International Light meter Model IL 1400A, and similar settings as above, the reading was 706 Lux. (lumens/sq. meter). The intensity of the EL display using this method is improved beyond what is achieved by the previous method.

Other films coated with pressure sensitive adhesives (AEROSET 1880 acrylic adhesive from Ashland Chemicals, Inc.,) or thermosetting adhesives can also be used with hot roll lamination.

Alternatively, the adhesion of the conductive pattern on subassembly 17 to the dielectric on subassembly 15 can be achieved through the co-solvents present in the conductive ink formulation. The co-solvent(s) which can plasticize the binder in the dielectric layer on subassembly 15 can improve the adhesion between the conductor and the dielectric through pressure and/or heat.

Another approach would be to apply an adhesion promoter such as a silane coupling agent between the two subassemblies prior to lamination.

Figure 4:
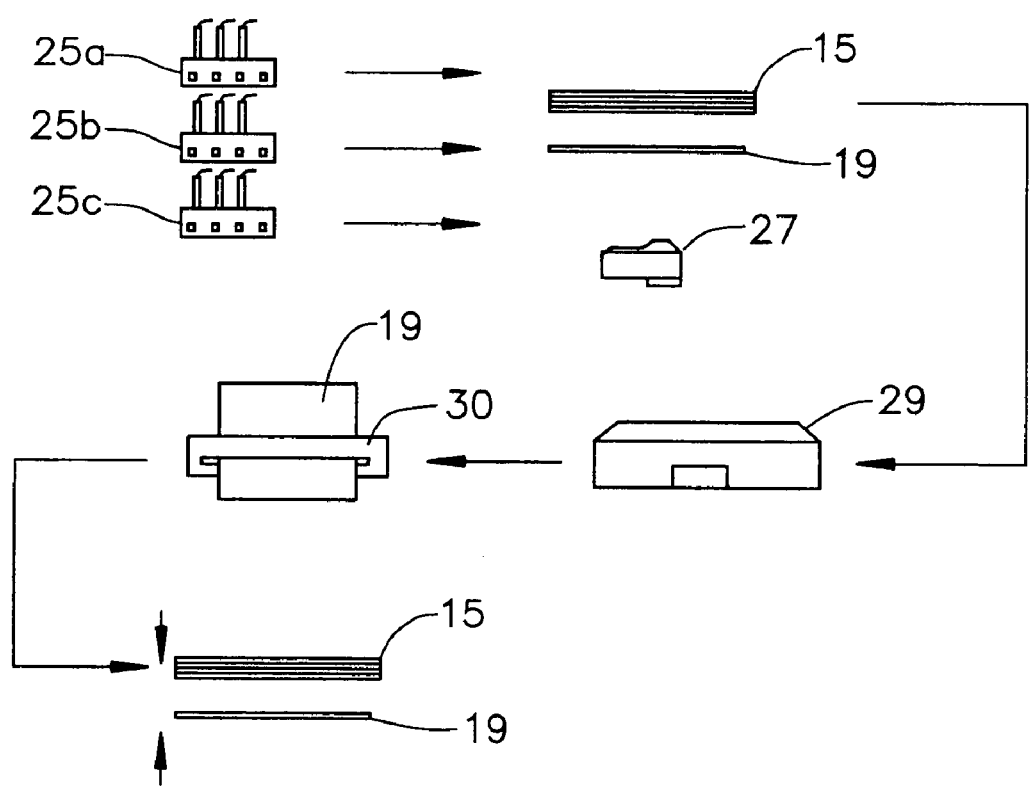
FIG. 4 is a business flow diagram illustrating application of this invention.

The business advantages and efficiencies encompassed by this invention are explained further with reference to FIG. 4. FIG. 4 is a business-flow diagram, which starts with commercial manufacturers 25a, 25b and 25c, which make separate items for commercial sale. Manufacturer 25a produces an electroluminescent stack subassembly, illustrated illustratively as subassembly 15. Manufacturer 25b produces a porous paper well suited for inkjet printing of a conductive ink, illustrated illustratively as paper 19. Manufacturer 25c produces an inkjet bottle or printhead 27 containing a silver ink. As envisioned by this invention, all of these items are readily available to the public by normal sale at one or more retails stores 29.

The retail customer is the end user. The retail customer prints the desired image on paper 19 conveniently at that person's home or business using the printhead 27 in an existing inkjet printer 29. The two subassemblies 15 and paper 19 with conductive pattern are then joined as described in the foregoing. The resulting device is conveniently and readily customized as desired by the end used (the retail customer).

Dismountable EL Display (Another Preferred Embodiment)

Another method of assembly uses mechanical means. This method allows a user to dismount the assembly and reuse subassembly 15, which provides cost effectiveness. The user can purchase subassembly 15 as a supply item. Then the pattern of choice is created by the customer through the printing of conductive ink on subassembly 17. The assembly is done through mechanical means.

In order for the electroluminescent device to provide high illumination intensity, one of the important factors is to eliminate the air gap that can exist between the dielectric layer 9 and the conductors 13. Thus, the planarity and smoothness of both conductors 13 and dielectric layer 9 are necessary to provide high illumination. Any non-planarity of the two layers will trap air and reduce the intensity when illuminated. Thus, when device 1 is held together mechanically it is important that enough pressure is acting on the two layers to provide intimate contact. However, this is very difficult to achieve.

Figure 5:
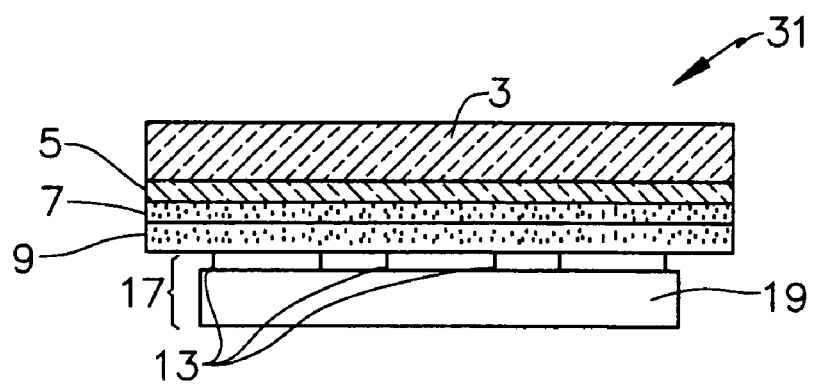
FIG. 5 illustrates a basic electroluminescent device intended to be held together by external pressure.

In the embodiment of FIG. 5, the complete EL device 31 corresponds to the EL device 1 except that it will have a liquid interface layer and is to be held together mechanically, as described in the following.

The material of dielectric layer 9 of device 31 as normally supplied commercially has a surface roughness of Ra 1.144-1.319 micrometers. When pre-processed in a hot roll laminator, the surface roughness is reduced to about 50%, to Ra of 0.485-0.727 micrometers. Such smoothing in a hot roll laminator is performed. However, some minute air gaps still would exist when conductors 13 and conductive layer 9 are pressed directly together.

To overcome this, an ultra-thin layer of highly viscous fluid is applied between subassembly 17 and dielectric layer 9 as an interface layer. This fluid helps eliminate the small air gaps and increases the intensity of illumination. This fluid also aids as a release coating and prevents the conductive pattern from transferring to the dielectric layer 9. In the embodiment of FIG. 5, during the assembly process, a thin layer of glycerol (not shown in FIG. 5) is coated preferably on the dielectric layer 9 prior to mating with the electrode conductors 13 on sheet 19. Glycols are a direct alternative to glycerol for this purpose, as well as glycerin, glycerol mixtures.

Figure 6:
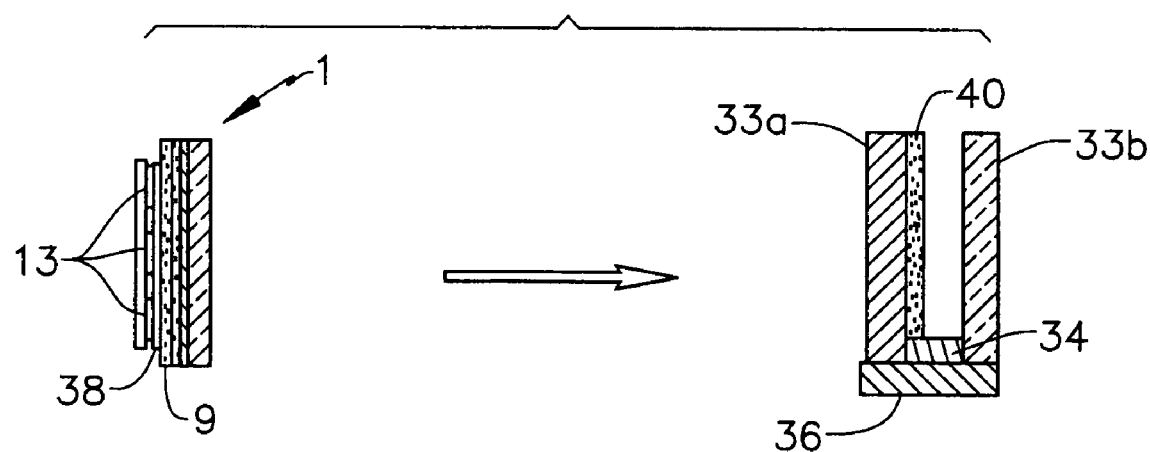
FIG. 6 illustrates a mechanical assembly in accordance with this invention.

As shown in FIG. 6, in an embodiment this laminate is then placed between two parallel but rigid plates 33a and 33b separated by a spacer 34 and having a pedestal or base 36. Device 31 is shown with a film 38 of glycerol (actually very thin) between conductor 13 and dielectric layer 9. A resilient material 40 is held on plate 33a to provide pressure to hold conductors 13 firmly against dielectric layer 9. Plates 33a and 33b alternatively can be held in a frame (not shown), depending on the design. The space between the plates 33a and 33b is held constant and uniform. If the plates 33a and 33b cover the top lamination 3 of device 31, then the plate 33a or 33b covering lamination 3 must be transparent so that a viewer can observe the illuminated display when an electrical potential is applied to the electrodes.

Figure 7:
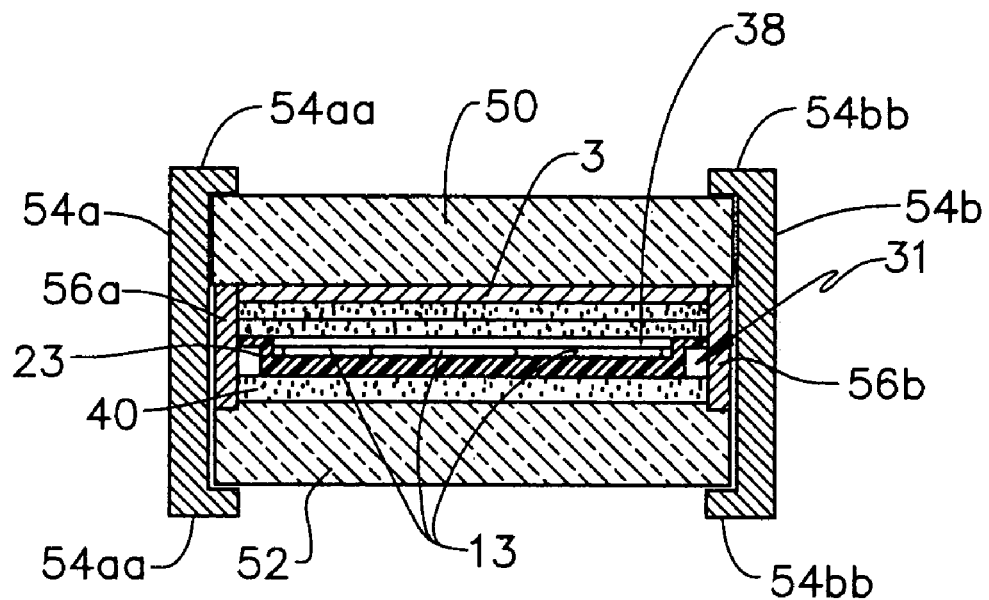
FIG. 7 illustrates a different mechanical assembly in accordance with this invention.

Another type of holder or frame is shown in FIG. 7. The device 31 has a plate 50 on the surface of top lamination 3. Bottom sheet 19 (shown in FIG. 5), with conductors 13, optionally within a sealant layer 23 as in the FIG. 3 embodiment, is contacted by a resilient material 40. Resilient material 40 is supported on a rigid bottom plate 52. One or both of plates 50 and 52 can be made from thick glass or a clear, transparent, but rigid plastic. This assembly is supported on its sides by brackets 54a and 54b having ledges 54aa and 54bb blocking upper plate 50 and lower plate 52 and by intermediate spacers 56a and 56b supported on brackets 54a and 54b respectively blocking device 1 from lateral movement.

In conjunction with the stiffness of the plates 50 and 52, resilient material 40 provides the pressure for sufficient contact between conductors 13, the interface liquid 38, and dielectric layer 9. Other shapes and designs of holders with suitable spacers and clamps or fasteners can also be used to provide the pressure uniformly. The holders can be made from either metal, plastic or composites, or glass.

Resilient material 40 provides sufficient spring force and uniformity. The resilient material 40 can be a spring or set of springs. The spring inserts can be metal, polymeric or composites, foam or solid, for example. In the assembly used for these descriptions, preferably the resilient material 40 is made of closely spaced, laterally unconnected resilient elements. The actual embodiment is the hook needles portion of a commercially available loop and hook fastener sold under VELCRO brand. Only one sheet is used, so it is used for the resilient properties of the small, curved elements of that material.

Figure 8:
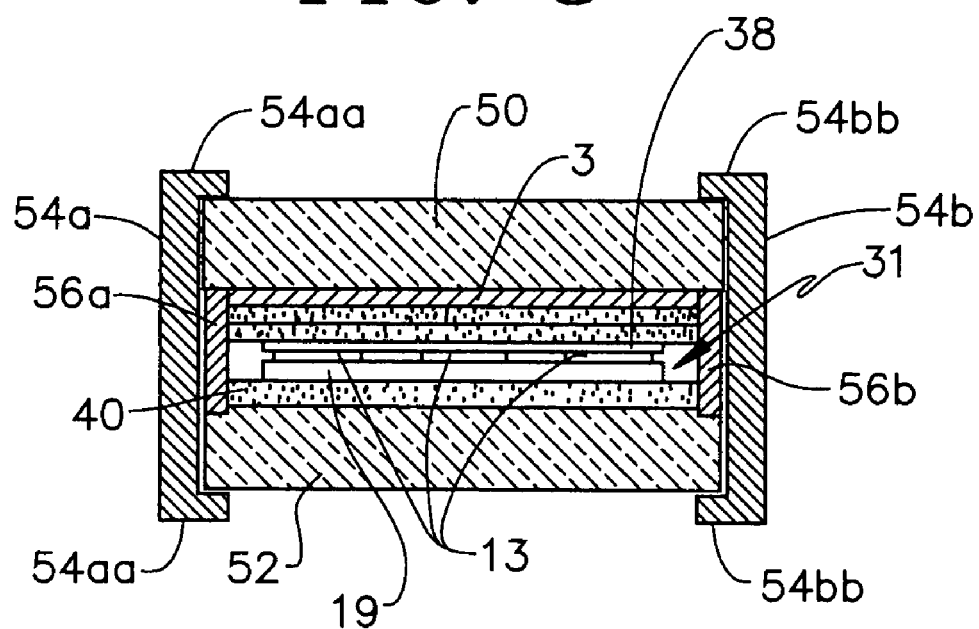
FIG. 8 illustrates a illustrates a variation of the assembly of FIG. 7

FIG. 8 depicts an assembly in which no sealant film 23 is used. The remainder of the embodiment is like the FIG. 7 embodiment. These devices can be dismounted and reassembled a number of times with no damage to the elements of device 31. A new sheet 19 with a customized conductive pattern 13 can be readily prepared by inkjet printer. When the assembly is reassembled to the conditions as shown in FIGS. 6-8, the display has changed at low cost.

As illustrative of other releasable holding means, adhesive may be used or a vacuum may be generated across the front of sheet 19. If adhesive is used, it must stay with the sheet 19 as it is pulled from the device 31 or it must remain in device 31 in good form to hold the next sheet 19. If the adhesive stays with sheet 19, then the new sheet 19 would have adhesive applied for the same purpose.

In one design sheet 19 is a microporous synthetic paper, which readily accepts conductive ink from an inkjet printer. The sheet can be printed in a standard manner using silver ink or other conductive ink. The pattern can be generated in a personal computer or the like using standard capabilities and the printer is then driven from the computer as is also standard and very common.

Table II. below lists the effect of the glycerol upon the intensity of the display. Measurements were taken with an International light meter. The electroluminescent display is connected to a single ended ringing choke converter that is powered from a 9 volt battery and the voltage applied to the display was approximately +/−90 volts, AC. Other fluids with high permittivity (i.e., high dielectric constant) with suitable high viscosities and release properties can be used.

TABLE II

| Substrate I | Dielectric fluid | Assembly | Luminescence (LUX) |
|---|---|---|---|
| No pre-treatment | None | clamps/glass plates | 72 |
| No pre-treatment | Glycerol | clamps/glass plates | 150 |
| Pretreatment | None | clamps/glass plates | 190 |
| Pretreatment | Fluid - PEG 400 | clamps/glass plates | 170 |
| Pretreatment | Glycerol | clamps/glass plates | 207 |

Accordingly, the device as a whole has an indefinite life, while the sheet 11 can be replaced with various patterns, which may be locally made, all at low cost.

What is claimed is:

1. A customized electroluminescent device comprising a first subassembly comprising a front for emitting light produced by electroluminescence in said subassembly, a dielectric layer, and an electroluminescent layer between said front and said dielectric layer, an electroconductive layer between said electroluminescent layer and said front, and a second subassembly comprising a layer having electrical conductor in a pattern, said second subassembly being smaller in width than the width of said first subassembly and being positioned in contact with said first assembly to leave a boundary around said second subassembly, and a thermoplastic seal covering said second subassembly and directly attached to said first subassembly at said boundary to hold said first subassembly and said second subassembly together to provide a capacitive circuit with said electrical conductor in a pattern to cause electroluminescence by the electroluminescent layer in a pattern defined by said electrical conductor in a pattern, and an inert, dielectric liquid between and contacting said electrical conductor in a pattern, of the second subassembly, and said dielectric layer, of the first subassembly.

2. An assembly for an electroluminescent display, said display comprising
   a front for emitting light produced by electroluminescence in said assembly,
   a back layer having electrical conductor in a pattern,
   an electroluminescent layer between said front and said back,
   a dielectric layer between said electroluminescent layer and said back, and
   an inert, dielectric liquid between and contacting said electrical conductor in a pattern and said dielectric layer,
   an electrically conductive layer between said front and said electroluminescent layer to provide a capacitive circuit with said conductor in a pattern to cause electroluminescence by the electroluminescent layer in a pattern defined by said conductor in a pattern.

3. An assembly as in claim 2 in which said back layer is a sheet for receiving said conductive ink from a printer.

4. An assembly as in claim 3 in which said inert liquid is glycerol, a glycol or a glycerine, glycol mixture.

5. An assembly as in claim 2 in which said inert liquid is glycerol, a glycol, or a glycerine, glycerol mixture.

6. An assembly for an electroluminescent display, said display comprising a front for emitting light produced by electroluminescence in said assembly, a back having a removable sheet having electrical conductor in a pattern, an electroluminescent layer between said front and said back, and a dielectric layer between said electroluminescent layer and said back, and an electrically conductive layer between said front and said electroluminescent layer to provide a capacitive circuit with said conductor in a pattern to cause electroluminescence by the electroluminescent layer in a pattern defined by said conductor in a pattern, said removable element being a sheet for receiving conductive ink from a printer and being held in contact with an adjoining layer of said assembly by releasable pressure means and an inert, dielectric liquid is between and contacting said electrical conductor in a pattern and said dielectric layer.

7. An assembly as in claim 6 in which said sheet is pressed against said assembly by resilient material while said assembly is held between brackets.

8. An assembly as in claim 7 in which said resilient material comprises closely spaced, laterally unconnected resilient elements.

9. An assembly as in claim 6 in which said inert liquid is glycerol, a glycol or a glycerine, glycol mixture.

10. An assembly for an electroluminescent display, said display comprising a front for emitting light produced by electroluminescence in said assembly, a back layer having electrical conductor in a pattern, an electroluminescent layer between said front and said back layer, a layer of resilient material, a dielectric layer between said electroluminescent layer and said back layer, said dielectric layer being held against said back layer by said resilient material, and an electrically conductive layer between said front and said electroluminescent layer to provide a capacitive circuit with said conductor in a pattern to cause electroluminescence by the electroluminescent layer in a pattern defined by said conductor in a pattern, and an inert, dielectric liquid is between and contacting said electrical conductor in a pattern and said dielectric layer.

11. An assembly as in claim 10 in which said resilient material comprises closely spaced, laterally unconnected resilient elements.

* * * * *